(12) United States Patent
Xu et al.

(10) Patent No.: US 11,217,974 B2
(45) Date of Patent: Jan. 4, 2022

(54) ELECTRONIC DEVICE AND WIRE MANAGEMENT DEVICE

(71) Applicant: Lenovo (Beijing) Co., Ltd., Beijing (CN)

(72) Inventors: Lianfeng Xu, Beijing (CN); Xiaohua Li, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 12 days.

(21) Appl. No.: 16/829,418

(22) Filed: Mar. 25, 2020

(65) Prior Publication Data
US 2020/0313410 A1   Oct. 1, 2020

(30) Foreign Application Priority Data
Mar. 25, 2019 (CN) .......................... 201910227969.5

(51) Int. Cl.
*H02G 3/04* (2006.01)
*H02G 11/00* (2006.01)
*H02G 11/02* (2006.01)

(52) U.S. Cl.
CPC ........... *H02G 3/0437* (2013.01); *H02G 11/00* (2013.01); *H02G 11/02* (2013.01)

(58) Field of Classification Search
CPC ....... H02G 3/0437; H02G 11/00; H02G 11/02
See application file for complete search history.

(56) References Cited

U.S. PATENT DOCUMENTS

| | | | | |
|---|---|---|---|---|
| 4,840,449 A * | 6/1989 | Ghandeharizadeh | .. | G02B 6/444 385/135 |
| 5,482,100 A * | 1/1996 | Kuhar | ....................... | E06B 9/32 160/170 |
| 5,877,936 A * | 3/1999 | Nishitani | ............ | B60R 16/0215 174/69 |
| 6,427,290 B1 * | 8/2002 | Liu | ........................ | B65H 75/36 24/16 R |
| 6,761,203 B1 * | 7/2004 | Huang | .................... | E06B 9/322 160/170 |
| 7,081,588 B2 * | 7/2006 | Kogure | .................... | H02G 3/34 174/72 A |
| 8,315,498 B2 * | 11/2012 | Redmann | ............. | G02B 6/4452 385/135 |
| 2005/0000718 A1 * | 1/2005 | Kogure | ............... | B60R 16/0215 174/542 |
| 2013/0170810 A1 * | 7/2013 | Badar | .................. | G02B 6/4471 385/135 |

FOREIGN PATENT DOCUMENTS

| | | |
|---|---|---|
| CN | 206232233 U | 6/2017 |
| JP | H06152160 A | 5/1994 |
| TW | 201352115 A | 12/2013 |

* cited by examiner

*Primary Examiner* — Steven T Sawyer
*Assistant Examiner* — Paresh H Paghadal
(74) *Attorney, Agent, or Firm* — Anova Law Group, PLLC (57) ABSTRACT

A wire management device includes two routing channels and wire management pieces. The routing channels are configured to import and export a wire. The wire management pieces are placed between the two routing channels and move to tighten and loosen the wire, changing a length of the wire between the two routing channels.

18 Claims, 6 Drawing Sheets

ELECTRONIC DEVICE AND WIRE MANAGEMENT DEVICE

CROSS-REFERENCE TO RELATED APPLICATION

This application claims priority to Chinese Patent Application No. 201910227969.5, filed on Mar. 25, 2019, the entire content of which is incorporated herein by reference.

TECHNICAL FIELD

The present disclosure relates to an electronic device technical field and, more particularly, to a wire management device and an electronic device having the wire management device.

BACKGROUND

An electronic device often has a large number of wires. Some of the wires need to be pulled or loosened during operation. Therefore, a technical solution is provided for accommodating wire movements in an electronic device.

SUMMARY

Embodiments of the present disclosure provide a wire management device including two routing channels and wire management pieces. The routing channels are configured to import and export a wire. The wire management pieces are placed between the two routing channels and move to tighten and loosen the wire, changing a length of the wire between the two routing channels.

Embodiments of the present disclosure provide an electronic device including a wire management device, a first body, and a second body, where the wire management device includes two routing channels and wire management pieces. The routing channels are configured to import and export a wire. The wire management pieces are placed between the two routing channels and move to tighten and loosen the wire, changing a length of the wire between the two routing channels. The first body and the second body are electrically connected by the wire.

In FIG. 1-FIG. 6, reference numerals are as follows:
1—routing channel, 2—wire, 3—first wire management piece, 4—second wire management piece, 5—housing, 6—reset elastic piece, 7—protective film, 8—screw, 9—first body.

DETAILED DESCRIPTION OF THE EMBODIMENTS

The present disclosure provides a wire management device, which can comb and store a relatively long wire, avoid wire damages and negatively impacts to the external appearance, and improve work performance of an electronic device.

The embodiments of the present disclosure are described clearly as follows in connection with accompanying drawings of the embodiments of the present disclosure. The described embodiments are merely some of the embodiments of the present disclosure, but not all the embodiments. Based on the embodiments of the present disclosure, all other embodiments obtained by those of ordinary skill in the art without any creative effort are within scope of the present disclosure.

As shown in FIG. 1-FIG. 6, the present disclosure provides a wire management device, which can be placed in an electronic device and is configured to comb and store a wire 2 between two relatively rotating bodies of the electronic device.

In the embodiments of the present disclosure, the electronic device may be a laptop. In an electronic device such as a laptop, etc., a wire often needs to be arranged between a display and a laptop body, which rotate relatively to each other, to implement power supply and data transmission. When the display and the laptop body are at different angles, a length of the wire distributed between the display and the laptop body may be different. For example, when the angle between the display and the laptop body is 0° and 360°, the wire between the display and the laptop body has a longest length, and when the angle between the display and the laptop body is 180°, the wire between the display and the laptop body has a shortest length. To ensure the electronic device would work normally, a reserved length of the wire between the display and the laptop body should be the longest length, that is, the length required when the angle between the display and the laptop body is 0° and 360°. When the angle between the display and the laptop body is at other values, the long wire is curled and squeezed irregularly, which not only has a problem of showing the exposed wire and negative impacts the aesthetics, but also affects service life due to damages caused by frequent and excessive curling and squeezing of the wires. This may impair the work performance of the electronic device.

The wire management device of the present disclosure may include routing channels 1 and wire management pieces. The wire manage device may include at least two routing channels 1. Of the two routing channels 1, one routing channel is configured to import wire 2, and the other routing channel is configured to export wire 2. The wire management pieces are arranged between routing channel 1 configured to import wire 2 and routing channel 1 configured to export wire 2. The wire management pieces can move forward to press wire 2 to bend, that is, to tighten wire 2, such that the length of wire 2 distributed between the two routing channels 1 increases. wire 2 may be combed by the wire management pieces, such that wire 2 is stored (in other word gathered) regularly between the two routing channels 1. This would avoid irregular curling and squeezing, reduce the damages of wire 2, and improve the work performance of the electronic device. Further, the wire management device would also avoid a situation of accumulating wire 2 out of the two routing channels 1 to expose wire 2 outside, which improves the appearance of the electronic device. When wire 2 needs to be exported, wire 2 drives the wire management pieces to move in opposite directions. The wire management pieces gradually reduce pressure to wire 2 to loosen wire 2 until wire 2 returns to an original trajectory. At the same time, wire 2, when of changing from a tightened state to a loose state, is pulled and exported by an external force to reduce the length of wire 2 between the two routing channels 1.

As shown in FIG. 1-FIG. 6, the wire management device of the embodiments further includes a housing 5, through which wire 2 passes. Routing channel 1 is placed at a surface of the housing 5, and the wire management pieces are located inside the housing 5. To better accommodate wire management device 5 and to better avoid interference between wire 2 and other components of the electronic device, the housing 5 of the embodiments of the present disclosure have a few features. The housing 5 has an inner chamber, and routing channels 1 are placed at the surface of the housing 5, that is, a through hole connecting the inner chamber is opened at the housing 5 to form routing channels 1, such that wire 2 can be imported to the inner chamber and exported from the inner chamber. The wire management pieces are placed in the inner chamber and move in the inner chamber to implement combing and storing wire 2 at the housing 5. Without considering the above-mentioned situation, routing channels 1 and the wire management pieces can also be placed in the housing of the electronic device and are in a same space with other electronic components of the electronic device.

Figure 2:
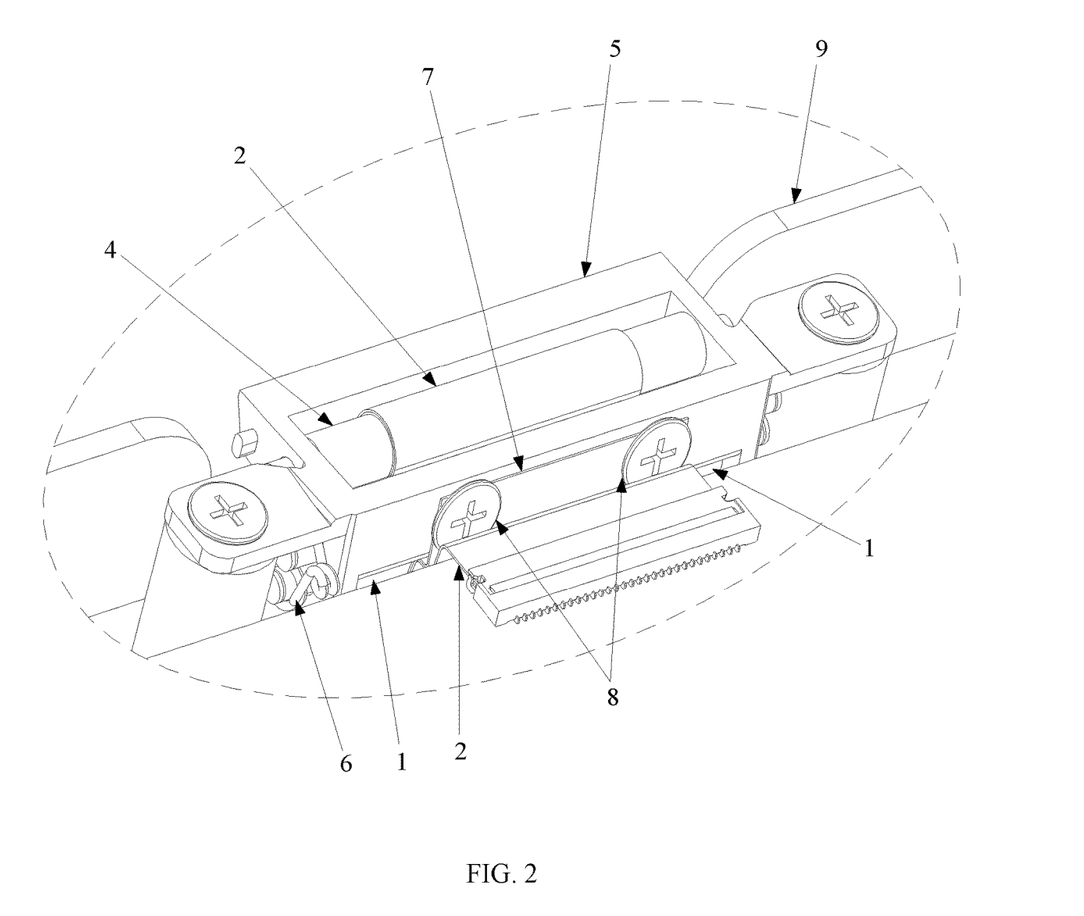
FIG. 2 is an enlarged diagram of a portion of FIG. 1.
Figure 3:
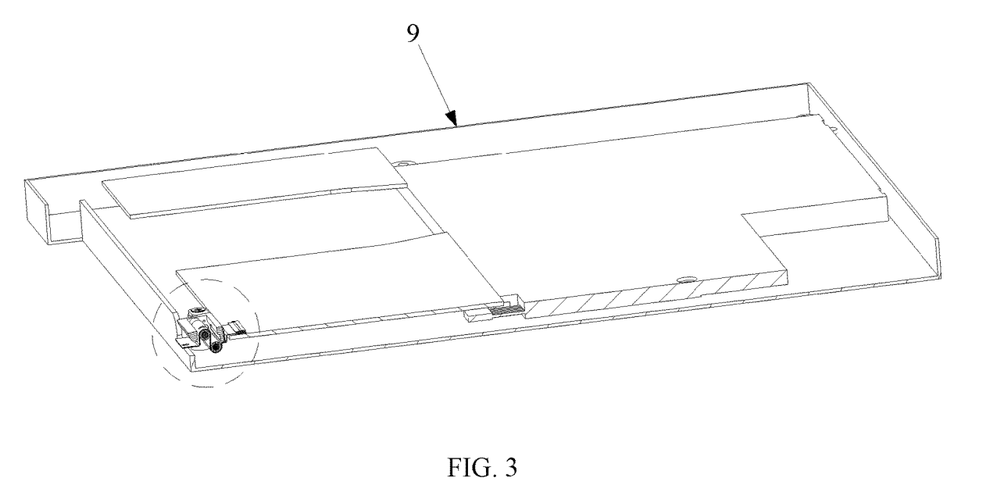
FIG. 3 is a sectional view of a wire management device and a first body.
Figure 4:
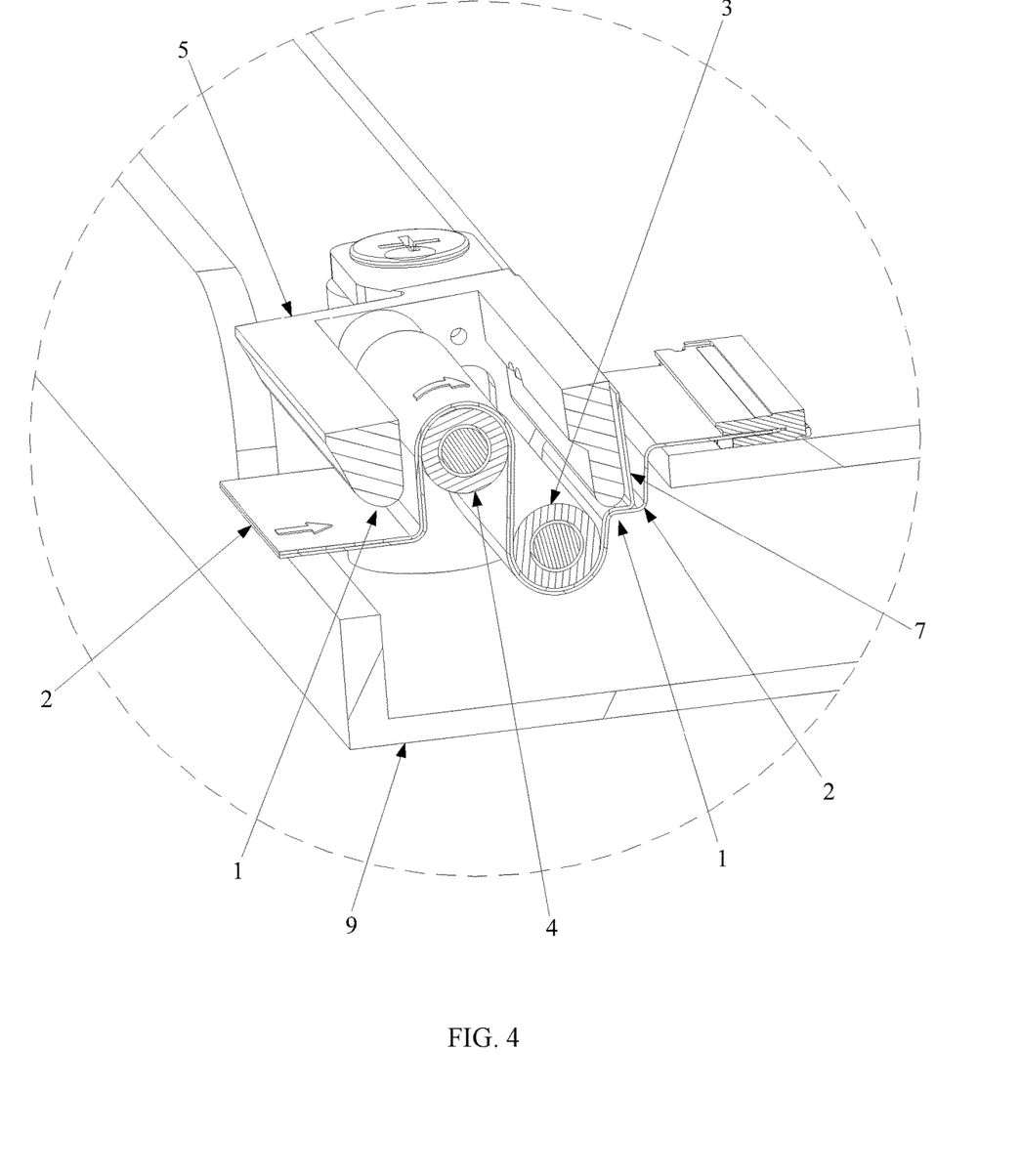
FIG. 4 is an enlarged diagram of a portion of FIG. 3.
Figure 5:
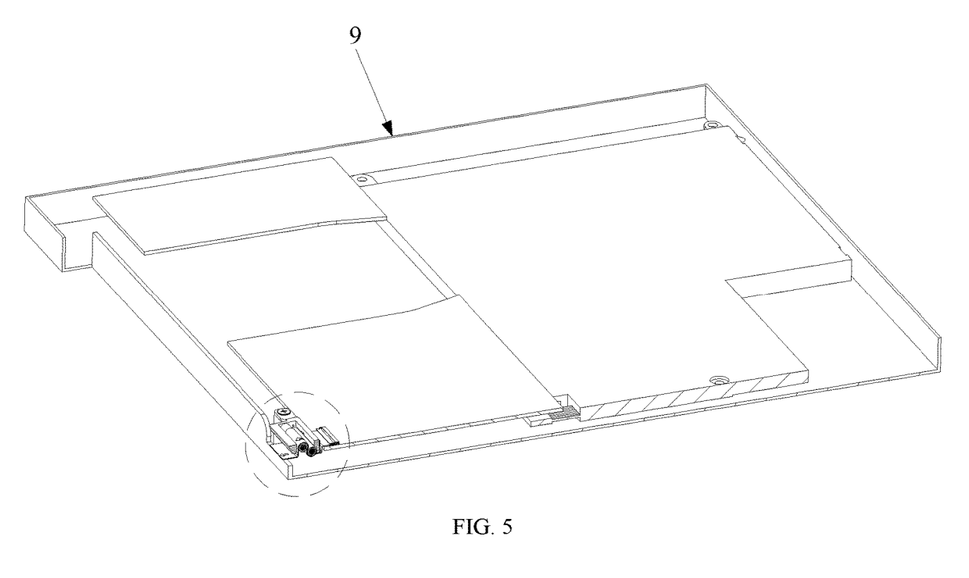
FIG. 5 is a sectional view of a wire management device and a first body.
Figure 6:
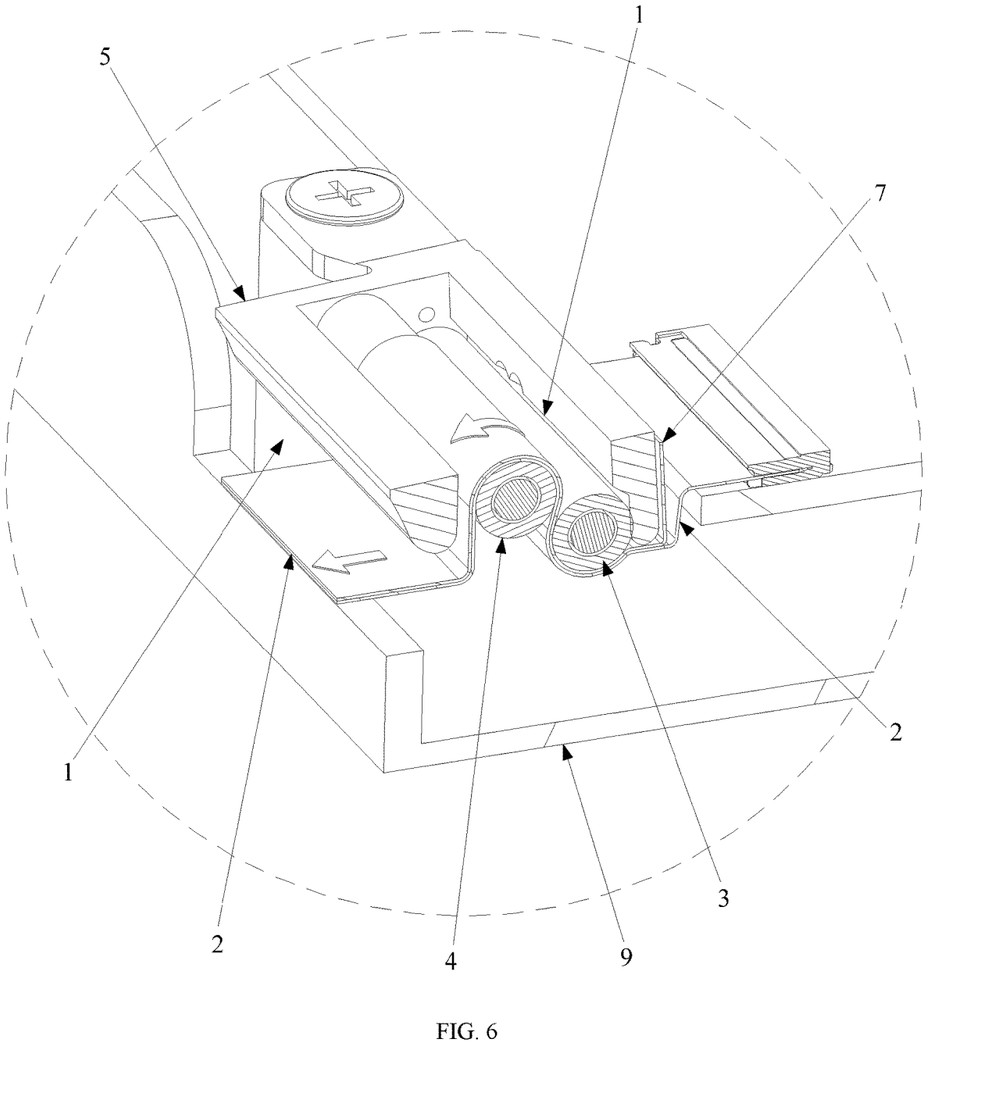
FIG. 6 is an enlarged diagram of a portion of FIG. 5.

As shown in FIG. 1-FIG. 6, the wire management pieces include a first wire management piece 3 and a second wire management piece 4. Wire 2 passes between first wire management piece 3 and second wire management piece 4, and is wrapped on a S-shape at circumferential surfaces of first wire management piece 3 and second wire management piece 4. First wire management piece 3 and/or second wire management piece 4 are slidably placed at the housing 5. First wire management piece 3 and second wire management piece 4 change a distance therebetween to tighten or loosen wire 2. In some embodiments, the wire management piece for tightening and loosening wire 2 may be one-piece. In some embodiments, to increase the tightening and loosing length for wire 2, two wire management pieces are placed, that is, first wire management piece 3 and second wire management piece 4. The two wire management pieces move toward two directions opposite to each other. When the wire needs to be tightened, as shown in FIG. 4 and as indicated by arrows, first wire management piece 3 moves in a first direction at the same time, second wire management piece 4 moves in a second direction opposite to the first direction (relative to the perspective of FIG. 4, the two opposite directions are up and down), such that the distance between the two wire management pieces increases, so that the longer wire 2 is wrapped at the circumferential surfaces of the two wire management pieces to regularly comb and store wire 2. When wire 2 needs to be exported, as shown in FIG. 6 and as indicated by arrows, first wire management piece 3 and second wire management piece 4 move oppositely to the previously directions to reduce the distance therebetween to loosen wire 2. The length of wire 2 wrapped at the two wire management pieces is reduced and wire 2 is exported. In an above-mentioned process, a movement method of first wire management piece 3 and second wire management piece 4 is preferably moving linearly, that is, first wire management piece 3 and/or second wire management piece 4 are slidably placed at the housing 5. In some embodiments, when slidably placed, one of first wire management piece 3 and second wire management piece 4 is slidably placed at the housing 5, and the other one is fixedly placed at the housing 5. One of the wire management pieces slides forward and backward to change the distance between first wire management piece 3 and second wire management piece 4. In some embodiments, first wire management piece 3 and second wire management piece 4 can both slidably placed at the housing 5. The two wire management pieces move relative to each other to change the distance therebetween. In the embodiments, to simplify a structure and reduce assembly difficulty, first wire management piece 3 is slidably placed at the housing 5, and second wire management piece 4 is fixedly placed at the housing 5. In some embodiments, first wire management piece 3 and second wire management piece 4 may rotate. For example, the wire management device may include hooks placed at first wire management piece 3 and second wire management piece 4, wire 2 passes through the hook. When wire 2 does not need to be stored, the hooks do not apply forces to wire 2. When wire 2 needs to be stored, one of first wire management piece 3 and second wire management piece 4 rotates clockwise, and the other one of first wire management piece 3 and second wire management piece 4 rotates counter clockwise to drive the hooks to rotate, so as to pull wire 2 to be wrapped at first wire management piece 3 and second wire management piece 4 to tighten wire 2. This increases the distribution length of wire 2 between first wire management piece 3 and second wire management piece 4. In the reversed scenario, wire 2 is loosened, and the distribution length of wire 2 between first wire management piece 3 and second wire management piece 4 is reduced.

In some embodiments, the wire management device may loosen/slide first wire management piece 3 and/or second wire management piece 4 is by pulling of wire 2. Tightening/sliding of first wire management piece 3 and/or second wire management piece 4 is implemented by driving of a reset elastic piece 6. As shown in FIG. 2, since the wire management device placed by embodiments of the present disclosure is mainly configured to comb and store wire 2 between two relatively rotating components of the electronic device, when the two components of the electronic device (thereafter mentioned as a first body 9 and a second body) are opened through a relative rotation, the rotating second body pulls wire 2. Based on this principle, to reduce the number of driving components, wire 2 pulls to reduce the distance between first wire management piece 3 and second wire management piece 4 to implement the loosening/sliding of wire 2. When the two components are closed or shut, no force is applied to wire 2, therefore, a specifically placed driving component is required to increase the distance between first wire management piece 3 and/or second wire management piece 4 to implement the tightening/sliding of wire 2. The driving component of the embodiments is reset elastic piece 6. A position, when first wire management piece 3 and/or second wire management piece 4 are at the tight state, is used as an initial position for first wire management piece 3 and/or second wire management piece 4, and wire 2 is stored. When first wire management piece 3 and/or second wire management piece 4 approach to each other by the pulling of wire 2, that is, during the process that wire 2 changes from the tight state to the loose state, reset elastic piece 6 deforms elastically, and an elastic force applied to first wire management piece 3 and/or second wire management piece 4 by reset elastic piece 6 increases. However, the elastic force is not enough to overcome a pulling force of wire 2, so the distance between first wire management piece 3 and second wire management piece 4 continues to increase, and wire 2 continues to transit to the loose state. When wire 2 is no longer pulled, that is, wire 2 needs to be stored, since wire 2 loses the pulling force, so first wire management piece 3 and/or second wire management piece 4 reset to the initial position driven by reset elastic piece 6, and at this point, wire 2 is reset to the tight state and is stored.

In the structure described above, reset elastic piece 6 is outside the housing 5. One end of reset elastic piece 6 is fixedly connected to the housing 5, and the other end of reset elastic piece 6 is connected to first wire management piece 3 and/or second wire management piece 4. In some embodiments, when the movement method of first wire management piece 3 and/or second wire management piece 4 is sliding, reset elastic piece 6 may be a coil spring, a torsion spring, a plate spring, etc. When the movement method of first wire management piece 3 and/or second wire management piece 4 is the rotation, reset elastic piece 6 may be a torsion spring.

As shown in FIG. 2, FIG. 4, and FIG. 6, the wire management device further includes a protective film 7 wrapping around wire 2. One end of protective film 7 is fixed to an outside surface of the housing 5. When wire 2 is imported and exported, sliding friction happens inevitably with routing channels 1 and the wire management pieces. To avoid the damages of wire 2 due to the sliding friction, protective film 7 is wrapping around wire 2 to protect wire 2. In some embodiments, one end of protective film 7 (i.e., an end located inside the first body 9 of the electronic device) is fixed at the outside surface of the housing 5 with 8 screws. As shown in FIG. 2, when protective film 7 enters routing channel 1 and is about to extend into the inner chamber of the housing 5, protective film 7 meets wire 2, which is also introduced to this position, such that protective film 7 wraps around wire 2 and moves with wire 2. In some embodiments, except one side of wire 2, which is connected to the body 9 and outside the housing 5, is not covered with protective film 7, the rest part of wire 2 located inside the housing 5 and led out from the housing 5 and extending into the second body is wrapped with protective film 7.

In some embodiments, to reduce the sliding friction to minimal, the wire management pieces are wire management shafts contacting with wire 2 through the circumstantial surfaces. As shown in FIG. 2, FIG. 4, and FIG. 6, to be suitable for use of the electronic device such as a laptop, wire 2 is a cable that conforms to the circumferential surfaces of the wire management pieces.

The embodiments of the present disclosure further provide an electronic device, which includes the wire management device, and the first body 9 and the second body connected to each other by the wire. The wire and the wire management device are wire 2 and the wire management device as described herewith.

In some embodiments, when the first body 9 and the second body are closed or shut, the distance between first wire management piece 3 and second wire management piece 4 is the smallest, and the distribution length of wire 2 between the two routing channels 1 is the smallest. The closed state is when the angle between the first body 9 and the second body is 0° or 360°, and at this point, wire 2 needs to cross a shaft mechanism to connect the first body 9 and the second body and generally has a U-shape. When the angle between the first body 9 and the second body has other values, wire 2 has a shape such as a L-shape (at 90° or 270°), a linear shape (at 180°), etc., and has a shorter length compared to the U-shape. Therefore, there is extra wire 2 to be stored in the housing 5 (i.e., between the two routing channels 1). Based on this arrangement of the electronic device, when the first body 9 and the second body are in the closed state, the distance between first wire management piece 3 and second wire management piece 4 is the smallest, and the distribution length of wire 2 between the two routing channels 1 is the smallest.

Figure 1:
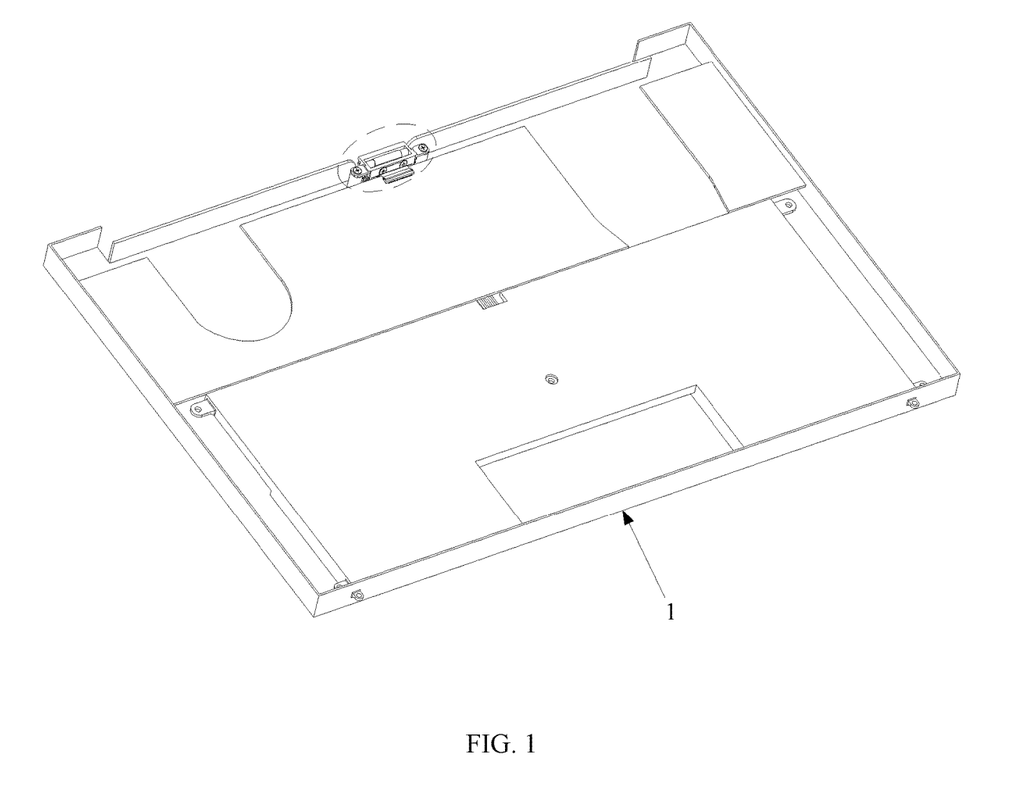
FIG. 1 is a schematic structural diagram of cooperation between a wire management device and a first body of an electronic device according to embodiments of the present disclosure.

In some embodiments, as shown in FIG. 1, FIG. 3, and FIG. 5, the wire management device is placed at the first body 9 of the electronic device and next to the shaft mechanism of the first body 9 and the second body, which are rotatably connected to each other. Since the first body 9 has a larger installation space, and to avoid an effect to a screen ratio of the second body, the wire management device of the embodiments is placed at the first body 9. By arranging the wire management device close to the shaft mechanism of the first body 9 and the second body, which are rotatably connected to each other, the overall length of wire 2 is reduced as much as possible, so that the wire management device can comb and store wire 2 with a larger length ratio to improve an effect of combing and storing wire 2.

In the present specification, the structure of each part is described in a progressive manner. The structure of each part focuses on differences from the existing structure. The overall and partial structure of the wire management device can be obtained by combining a plurality of above-mentioned partial structures.

In the embodiments of the present disclosure, the above description enables those skilled in the art to implement or use the present disclosure. Various modifications to these embodiments are apparent to those skilled in the art. In the present disclosure, the defined general principles may be implemented in other embodiments without departing from the spirit or scope of the present disclosure. Therefore, the present disclosure is not limited by the embodiments described in the specification, but should conform to the widest scope consistent with the principles and novel features disclosed in the specification.

What is claimed is:

1. A wire management device, comprising:
   two routing channels, configured to import and export a wire, the wire being configured to electronically connect a first body and a second body of an electronic device, the first body being rotatably connected with the second body;
   a reset elastic piece; and
   wire management pieces, placed between the two routing channels, wherein:
   the wire management pieces move to tighten and loosen the wire, changing a length of the wire between the two routing channels;
   the wire management pieces include a first wire management piece and a second wire management piece;
   the wire passes between the first wire management piece and the second wire management piece and is wrapped as a S-shape at circumferential surfaces of the first wire management piece and the second wire management piece;
   a distance between the first wire management piece and the second wire management piece changes to tighten or loosen the wire as a rotation angle between the first body and the second body changes; and
   the reset elastic piece deforms when the wire changes from a tight state to a loose state; and the reset elastic piece drives the first wire management piece and the second wire management piece to reset to an initial position.

2. The wire management device of claim 1, further comprising a housing, wherein:

the routing channels are placed at a surface of the housing; and the wire management pieces are located inside the housing.

3. The wire management device of claim 1, wherein:

one or more of the first wire management piece and the second wire management piece are slidably placed at the housing.

4. The wire management device of claim 1, wherein:

a loosening sliding of the first wire management piece and/or the second wire management piece is implemented by pulling of the wire; and tightening the sliding of the wire management piece and/or the second wire management piece is implemented by driving of the reset elastic piece.

5. The wire management device of claim 2, further comprising a protective film wrapping around the wire, wherein an end of the protective film is fixed at an outside surface of the housing.

6. The wire management device of claim 1, wherein the wire management pieces are wire management shafts, and the wire is a cable that conforms to a circumstantial surface of the wire management pieces.

7. The wire management device of claim 1, further comprising hooks, wherein:

the hooks are configured to: when the distance between the first wire management piece and the second wire management piece increases, pull the wire to be wrapped at the wire management pieces to tighten the wire, and when the distance between the first wire management piece and the second wire management piece decreases to loosen the wire, apply no force on the wire.

8. The wire management device of claim 2, wherein:

the reset elastic piece is placed outside the housing.

9. An electronic device, comprising a wire management device, a first body, and a second body rotatably connected with the first body through a shaft mechanism, wherein:

the wire management device is placed at the first body and close to the shaft mechanism and includes:

two routing channels, configured to import and export a wire;

a reset elastic piece; and wire management pieces, placed between the two routing channels, wherein the wire management pieces move to tighten and loosen the wire, changing a length of the wire between the two routing channels; and the first body and the second body are electrically connected by the wire, wherein:

the wire management pieces include a first wire management piece and a second wire management piece;

the wire passes between the first wire management piece and the second wire management piece and is wrapped as a S-shape at circumferential surfaces of the first wire management piece and the second wire management piece;

a distance between the first wire management piece and the second wire management piece changes to tighten or loosen the wire as a rotation angle between the first body and the second body changes; and the reset elastic piece deforms when the wire changes from a tight state to a loose state; and the reset elastic piece drives the first wire management piece and the second wire management piece to reset to an initial position.

10. The electronic device of claim 9, further comprising a housing, wherein:

the routing channels are placed at a surface of the housing; and the wire management pieces are located inside the housing.

11. The electronic device of claim 10, wherein:

one or more of the first wire management piece and the second wire management piece are slidably placed at the housing.

12. The electronic device of claim 9, wherein:

a loosening sliding of the first wire management piece and/or the second wire management piece is implemented by pulling of the wire; and tightening the sliding of the wire management piece and/or the second wire management piece are implemented by driving of a reset elastic piece.

13. The electronic device of claim 10, further comprising a protective film wrapping around the wire, wherein an end of the protective film is fixed at an outside surface of the housing.

14. The electronic device of claim 9, wherein the wire management pieces are wire management shafts, and the wire is a cable that conforms to a circumstantial surface of the wire management pieces.

15. The electronic device of claim 9, further comprising hooks, wherein:

the hooks are configured to: when the distance between the first wire management piece and the second wire management piece increases, pull the wire to be wrapped at the wire management pieces to tighten the wire, and when the distance between the first wire management piece and the second wire management piece decreases to loosen the wire, apply no force on the wire.

16. The electronic device of claim 9, wherein when the rotation angle between the first body and the second body is 180 degree, a distance between the first wire management piece and the second wire management piece is smallest, and the length of the wire between two routing channels is smallest.

17. The electronic device of claim 9, wherein when the rotation angle between the first body and the second body is 0 degree or 360 degree, a distance between the first wire management piece and the second wire management piece is longest, and the length of the wire between two routing channels is longest.

18. The electronic device of claim 9, wherein the wire is configured to transmit at least one of power and data between the first body and the second body of the electronic device.

* * * * *